United States Patent
Rodionov et al.

(10) Patent No.: US 12,463,622 B1
(45) Date of Patent: Nov. 4, 2025

(54) TIME DOMAIN-BASED POWER SUPPLY DROOP DETECTOR

(71) Applicants: Advanced Micro Devices, Inc., Santa Clara, CA (US); ATI Technologies ULC, Markham (CA)

(72) Inventors: Mikhail Rodionov, Markham (CA); Dirk J. Robinson, Fort Collins, CO (US); Joyce Cheuk Wai Wong, Markham (CA)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 25 days.

(21) Appl. No.: 18/194,376

(22) Filed: Mar. 31, 2023

(51) Int. Cl.
*H03K 3/14* (2006.01)
*H03K 3/0231* (2006.01)
*H03K 5/135* (2006.01)
*H03K 5/1534* (2006.01)
*H03L 7/089* (2006.01)

(52) U.S. Cl.
CPC .......... *H03K 3/14* (2013.01); *H03K 3/0231* (2013.01); *H03K 5/135* (2013.01); *H03K 5/1534* (2013.01); *H03L 7/089* (2013.01)

(58) Field of Classification Search
None
See application file for complete search history.

(56) References Cited

U.S. PATENT DOCUMENTS

| | | | | |
|---|---|---|---|---|
| 6,882,238 B2* | 4/2005 | Kurd | .................. | G01K 7/32 |
| | | | | 331/74 |
| 7,821,249 B2* | 10/2010 | Nose | .................. | H03K 5/133 |
| | | | | 324/637 |
| 8,442,461 B2* | 5/2013 | Norimatsu | .......... | H04B 1/0483 |
| | | | | 455/115.2 |
| 11,108,382 B1* | 8/2021 | Wong | .................. | G06F 1/08 |
| 11,962,313 B2* | 4/2024 | Kosonocky | .......... | H03K 5/14 |
| 2019/0377079 A1* | 12/2019 | Park | .................. | G01S 7/4865 |

\* cited by examiner

*Primary Examiner* — Cassandra F Cox
(74) *Attorney, Agent, or Firm* — Greenberg Traurig, LLP (57) ABSTRACT

The disclosed device includes a reference delay circuit for outputting a reference delay circuit output signal from a voltage regulated supply and a noisy delay circuit for outputting a noisy delay circuit output signal from a noisy or droopy supply. The device also includes a phase comparator circuit that is connected to the reference delay circuit and the noisy delay circuit. The phase comparator circuit outputs a phase difference between the reference delay circuit output signal and the noisy delay circuit output signal. Various other methods, systems, and computer-readable media are also disclosed.

20 Claims, 5 Drawing Sheets

TIME DOMAIN-BASED POWER SUPPLY DROOP DETECTOR

BACKGROUND

A computing device such as a system-on-chip (SOC) often includes power management logic for managing power consumption for reliable operation as well as prevention of damage to components. The power management logic uses information about on-die power supply rail voltages. Components being switched on or off as well as other sources of noise can cause droops and/or spikes in the voltage, which can interfere with operation. For example, a clock signal frequency can be altered by droops and/or spikes. The droopy voltage signal can be managed with respect to a voltage regulated signal (e.g., a voltage regulated supply signal that is not used for powering components). However, some architectures can be insufficient for the fine resolution of voltage information with minimum latency needed for certain applications.

BRIEF DESCRIPTION OF THE DRAWINGS

The accompanying drawings illustrate a number of exemplary implementations and are a part of the specification. Together with the following description, these drawings demonstrate and explain various principles of the present disclosure.

Throughout the drawings, identical reference characters and descriptions indicate similar, but not necessarily identical, elements. While the exemplary implementations described herein are susceptible to various modifications and alternative forms, specific implementations have been shown by way of example in the drawings and will be described in detail herein. However, the exemplary implementations described herein are not intended to be limited to the particular forms disclosed. Rather, the present disclosure covers all modifications, equivalents, and alternatives falling within the scope of the appended claims.

DETAILED DESCRIPTION

The present disclosure is generally directed to a time domain-based power supply droop detector. As will be explained in greater detail below, implementations of the present disclosure provide a phase comparator circuit coupled to a reference delay circuit and a noisy delay circuit. The reference delay circuit converts a regulated voltage supply into a signal phase (e.g., a time domain signal) and the noisy delay circuit converts a noisy (e.g., droopy) voltage supply into a signal phase (e.g., a time domain signal). The phase comparator circuit outputs a phase difference (e.g., of the respective signal phases) that relates to a voltage difference between the regulated and noisy voltage supplies. As such, the systems and methods described herein provide a fast digital output for measuring power supply noise.

In one implementation, a device for a time domain-based power supply droop detector includes a reference delay circuit for providing a reference delay circuit output signal, a noisy delay circuit for providing a noisy delay circuit output signal, and a phase comparator circuit. The phase comparator circuit is coupled to the reference delay circuit and the noisy delay circuit and is configured to output a phase difference between the reference delay circuit output signal and the noisy delay circuit output signal.

In some examples, the reference delay circuit is connected to a regulated voltage supply and the reference delay circuit output signal corresponds to the regulated voltage supply converted to a time domain. In some examples, the noisy delay circuit is connected to a noisy voltage supply and the noisy delay circuit output signal corresponds to the noisy voltage supply converted to a time domain.

In some examples, the reference delay circuit corresponds to a first time delay circuit and the noisy delay circuit corresponds to a second time delay circuit. In some examples, the first time delay circuit matches the second time delay circuit. In some examples, the device includes an oscillator circuit, and the reference delay circuit and the noisy delay circuit are driven by the oscillator circuit.

In some examples, the phase comparator circuit corresponds to a time-to-digital converter (TDC). In some examples, the reference delay circuit and the noisy delay circuit are driven by an oscillator circuit. In some examples, the device includes an oscillator circuit that includes the reference delay circuit, the noisy delay circuit, the phase comparator circuit, and an edge detector circuit. In some examples, the edge detector circuit is coupled to the reference delay circuit and the noisy delay circuit and configured to receive the reference delay circuit output signal and the noisy delay circuit output signal and output a clock signal to the reference delay circuit and the noisy delay circuit. In some examples, the edge detector circuit is configured to toggle a polarity of the clock signal when the received reference delay circuit output signal and the received noisy delay circuit output signal share a same polarity.

In one implementation, a system for a time domain-based power supply droop detector includes (i) a reference delay circuit connected to a regulated voltage supply and configured to provide a reference delay circuit output signal that corresponds to the regulated voltage supply converted to a time domain, (ii) a noisy delay circuit connected to a noisy voltage supply and configured to provide a noisy delay circuit output signal that corresponds to the noisy voltage supply converted to the time domain, and (iii) a phase comparator circuit coupled to the reference delay circuit and the noisy delay circuit and configured to output a phase difference between the reference delay circuit output signal and the noisy delay circuit output signal.

In some examples, the reference delay circuit corresponds to a first time delay circuit and the noisy delay circuit corresponds to a second time delay circuit. In some examples, the first time delay circuit matches the second time delay circuit. In some examples, the system includes an oscillator circuit, and the reference delay circuit and the noisy delay circuit are driven by the oscillator circuit. In some examples, the phase comparator circuit corresponds to a time-to-digital converter (TDC).

In some examples, the reference delay circuit, the noisy delay circuit, and the phase comparator circuit are part of an oscillator circuit. In some examples, the oscillator circuit includes an edge detector circuit that is coupled to the reference delay circuit and the noisy delay circuit and configured to receive the reference delay circuit output signal and the noisy delay circuit output signal and output a clock signal to the reference delay circuit and the noisy delay circuit. In some examples, the edge detector circuit is configured to toggle a polarity of the clock signal when the received reference delay circuit output signal and the received noisy delay circuit output signal share a same polarity.

In one example, a method for time domain-based power supply droop detection includes (i) receiving, by a phase comparator circuit, a reference delay circuit output signal from a reference delay circuit, (ii) receiving, by the phase comparator circuit, a noisy delay circuit output signal from a noisy delay circuit, and (iii) outputting, by the phase comparator circuit, a phase difference between the reference delay circuit output signal and the noisy delay circuit output signal.

In some examples, the method also includes converting, by the reference delay circuit, a regulated voltage supply to a time domain to provide the reference delay circuit output signal, and converting, by the noisy delay circuit, a noisy voltage supply to the time domain to provide the noisy delay circuit output signal.

Features from any of the implementations described herein can be used in combination with one another in accordance with the general principles described herein. These and other implementations, features, and advantages will be more fully understood upon reading the following detailed description in conjunction with the accompanying drawings and claims.

The following will provide, with reference to FIGS. 1-5, detailed descriptions of a time domain-based power supply droop detector. Detailed descriptions of example systems and/or circuits for time domain-based power supply droop detectors will be provided in connection with FIGS. 1, 2, and 3. Detailed descriptions of voltage droop as it relates to signal frequency will be provided in connection with FIG. 4. Detailed descriptions of corresponding methods will also be provided in connection with FIG. 5.

Figure 1:
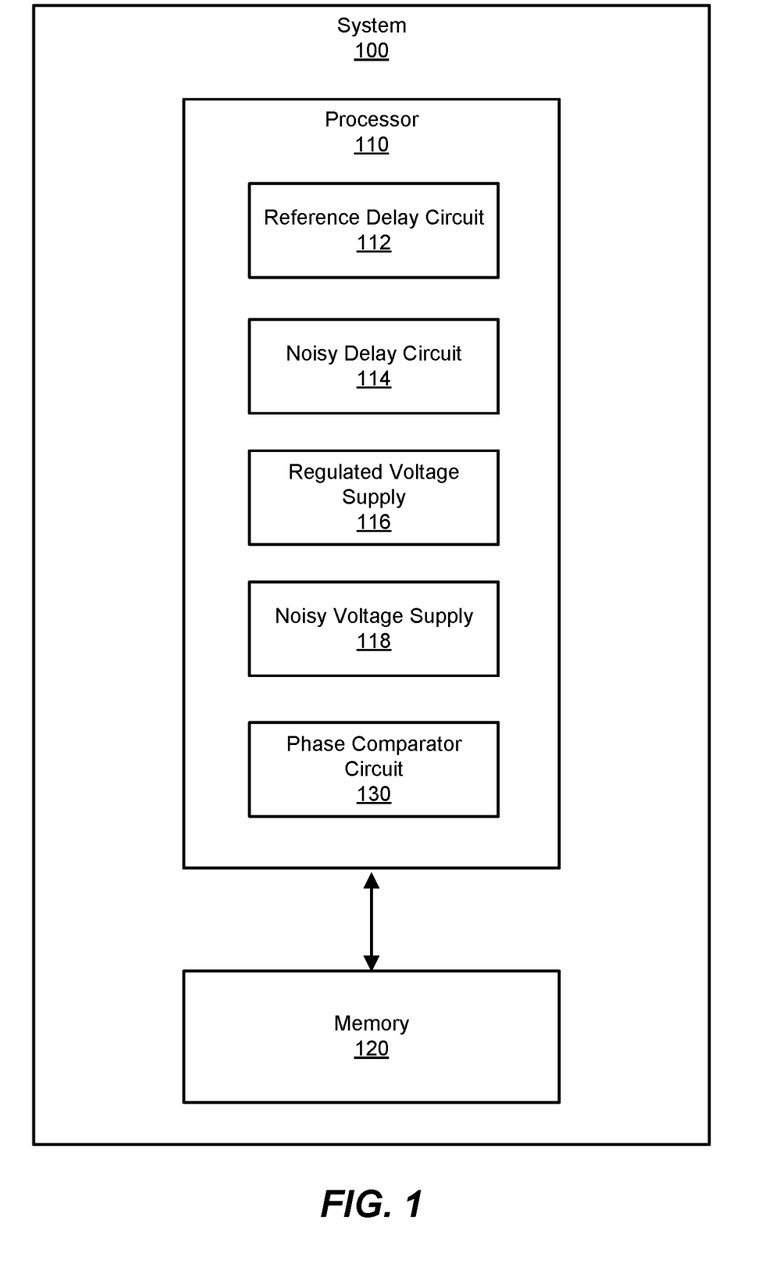
FIG. 1 is a block diagram of an exemplary system for a time domain-based power supply droop detector.

FIG. 1 is a block diagram of an example system 100 for a time domain-based power supply droop detector. System 100 corresponds to a computing device, such as a desktop computer, a laptop computer, a server, a tablet device, a mobile device, a smartphone, a wearable device, an augmented reality device, a virtual reality device, a network device, and/or an electronic device. As illustrated in FIG. 1, system 100 includes one or more memory devices, such as memory 120. Memory 120 generally represents any type or form of volatile or non-volatile storage device or medium capable of storing data and/or computer-readable instructions. Examples of memory 120 include, without limitation, Random Access Memory (RAM), Read Only Memory (ROM), flash memory, Hard Disk Drives (HDDs), Solid-State Drives (SSDs), optical disk drives, caches, variations, or combinations of one or more of the same, and/or any other suitable storage memory.

As illustrated in FIG. 1, example system 100 includes one or more physical processors, such as processor 110. Processor 110 generally represents any type or form of hardware-implemented processing unit capable of interpreting and/or executing computer-readable instructions. In some examples, processor 110 accesses and/or modifies data and/or instructions stored in memory 120. Examples of processor 110 include, without limitation, chiplets (e.g., smaller and in some examples more specialized processing units that can coordinate as a single chip), microprocessors, microcontrollers, Central Processing Units (CPUs), graphics processing units (GPUs), Field-Programmable Gate Arrays (FPGAs) that implement softcore processors, Application-Specific Integrated Circuits (ASICs), systems on chip (SoCs), digital signal processors (DSPs), Neural Network Engines (NNEs), accelerators, graphics processing units (GPUs), portions of one or more of the same, variations or combinations of one or more of the same, and/or any other suitable physical processor.

As further illustrated in FIG. 1, processor 110 includes a reference delay circuit 112, a noisy delay circuit 114, a regulated voltage supply 116, a noisy voltage supply 118, and a phase comparator circuit 130. Reference delay circuit 112 corresponds to a first time delay circuit (e.g., a circuit for creating a time/phase difference between its input and output, such as a delay line circuit) for converting regulated voltage supply 116 into a time domain (e.g., an oscillating signal or signal phase). Noisy delay circuit 114 corresponds to a second time delay circuit for converting noisy voltage supply 118 into a time domain (e.g., an oscillating signal or signal phase). Regulated voltage supply 116 corresponds to a voltage regulated power supply supplied to components of system 100. Noisy voltage supply 118 corresponds to a droopy supply voltage that exhibits noise, such as voltage droops and/or spikes from shutting on/off components of system 100, and other power supply noise. In order for system 100 to account for power supply noise for power management and protection of components, system 100 can compare noisy voltage supply 118 with regulated voltage supply 116. Phase comparator circuit 130 corresponds to a circuit for comparing time domain signals (e.g., signal phases), for instance comparing or finding a difference in phases between respective output signals. In some examples, phase comparator circuit 130 corresponds to a time-to-digital converter (TDC).

Figure 2:
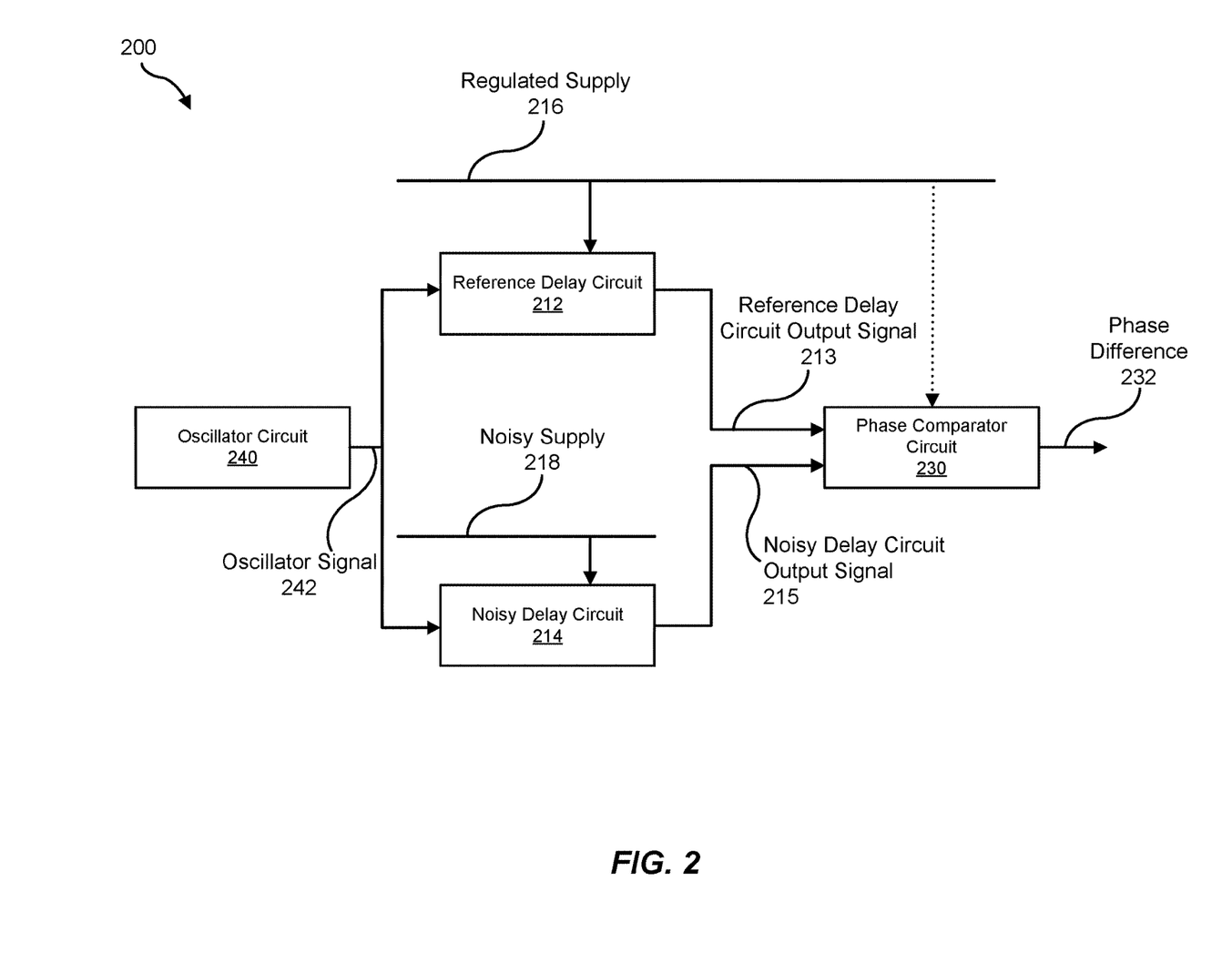
FIG. 2 is a basic diagram of an exemplary circuit for a time domain-based power supply droop detector.

FIG. 2 illustrates an example circuit 200 for a time domain-based power supply droop detector. Circuit 200 includes a reference delay circuit 212 corresponding to reference delay circuit 112, a noisy delay circuit 214 corresponding to noisy delay circuit 114, a phase comparator circuit 230 corresponding to phase comparator circuit 130, and an oscillator circuit 240. Reference delay circuit 212 is supplied by a regulated supply 216 corresponding to regulated voltage supply 116 and outputs a reference delay circuit output signal 213 (e.g., a conversion of regulated supply 216 to a time domain such as a signal phase). Noisy delay circuit 214 is supplied by a noisy supply 218 corresponding to noisy voltage supply 118 and outputs a noisy delay circuit output signal 215 (e.g., a conversion of noisy supply 218 to a time domain such as a signal phase). Oscillator circuit 240 corresponds to an oscillator circuit, such as a pulse generator, a clock circuit, for sending an oscillator signal 242 (e.g., a signal pulse or a clock signal).

In one implementation, reference delay circuit 212 and noisy delay circuit 214 can correspond to the same delay line circuit. In addition, because reference delay circuit 212 and noisy delay circuit 214 are driven by the same oscillating signal from oscillator circuit 240, any phase shifts between reference delay circuit output signal 213 and noisy delay circuit output signal 215 can be proportional to the voltage level difference between regulated supply 216 and noisy supply 218.

Phase comparator circuit 230, which in some examples corresponds to a TDC, outputs a phase difference 232 corresponding to a translation of the phase difference between reference delay circuit output signal 213 and noisy delay circuit output signal 215 into a digital code. The voltage-to-time conversion achieved by delay lines (e.g., reference delay circuit 212 and noisy delay circuit 214) can have a fast response with respect to power supply noise (e.g., as exhibited by noisy supply 218). A TDC also has a relatively small delay such that the overall voltage-to-digital code conversion provided by the systems and methods herein advantageously has a smaller latency than ring oscillator clock counter circuits.

Figure 3:
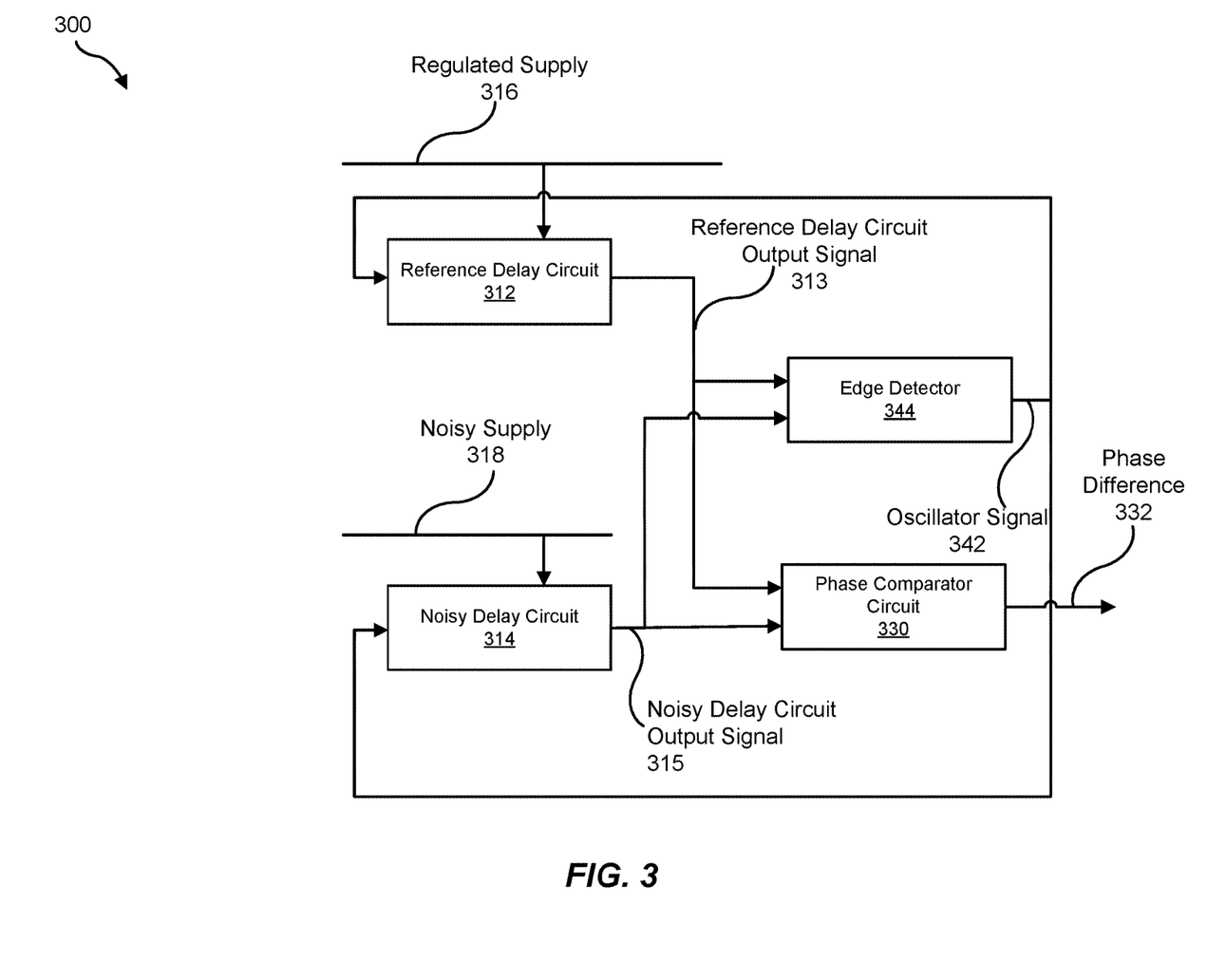
FIG. 3 is a basic diagram of an exemplary circuit for a time domain-based power supply droop detector integrated with an adaptive oscillator.

FIG. 3 illustrates an example circuit 300 for a time domain-based power supply droop detector. Circuit 300 includes a reference delay circuit 312 corresponding to reference delay circuit 112, a noisy delay circuit 314 corresponding to noisy delay circuit 114, a phase comparator circuit 330 corresponding to phase comparator circuit 130, and an edge detector 344. Reference delay circuit 312 is supplied by a regulated supply 316 corresponding to regulated voltage supply 116 and outputs a reference delay circuit output signal 313 (e.g., a conversion of regulated supply 316 to a time domain such as a signal phase). Noisy delay circuit 314 is supplied by a noisy supply 318 corresponding to noisy voltage supply 118 and outputs a noisy delay circuit output signal 315 (e.g., a conversion of noisy supply 318 to a time domain such as a signal phase).

Similar to phase comparator circuit 230 in FIG. 2, phase comparator circuit 330 outputs a phase difference 332 corresponding to a digital output of a phase shift or difference between reference delay circuit output signal 313 and noisy delay circuit output signal 315. As further described herein, this phase shift corresponds to a voltage difference between regulated supply 316 and noisy supply 318 such that phase difference 332 provides a digital output for measuring power supply noise.

Edge detector 344 corresponds to an adaptive oscillator circuit for sending an oscillator signal 342. Edge detector 344 can adjust oscillator signal 342 in response to power supply noise (e.g., voltage droops and/or spikes) exhibited by noisy supply 318. In some examples, edge detector 344 can toggle a polarity of oscillator signal 342 (e.g., a clock signal) when both inputs (e.g., reference delay circuit output signal 313 and noisy delay circuit output signal 315) have a same polarity. When both inputs are in unison (e.g., having no phase difference), oscillator signal 342 can output at the same frequency as the inputs. However, when noisy delay circuit output signal 315 exhibits changes in phase (due to droops and/or spikes in noisy supply 318), edge detector 344 can act as a frequency adjuster, with further reference to FIG. 4.

Figure 4:
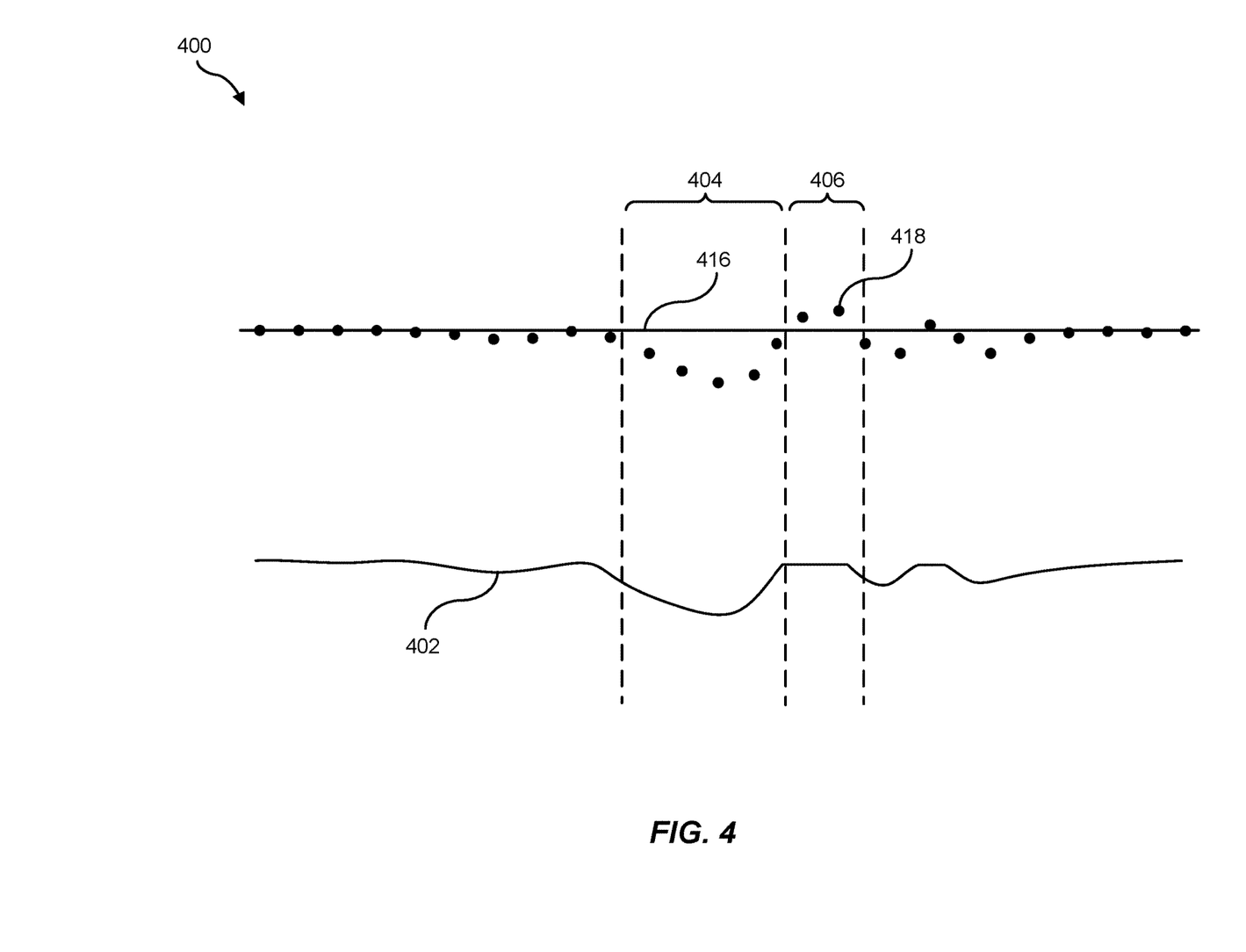
FIG. 4 is signal diagram of voltage droop relating to signal frequency.

FIG. 4 illustrates a basic signal diagram 400 relating voltage to frequency for an adaptive oscillator as in FIG. 3. FIG. 4 illustrates a regulated voltage supply 416, corresponding to regulated supply 316 and represented by a straight line, a noisy voltage supply 418, corresponding to noisy supply 318 and represented by a dotted line, and a frequency 402. Frequency 402 corresponds to a frequency of an oscillating signal (e.g., a clock signal such as oscillator signal 342) that can be driven, at least in part, by noisy voltage supply 418. As illustrated in FIG. 4, frequency 402 can be affected by voltage droops and/or spikes. For instance, during a voltage droop 404, a frequency of noisy voltage supply 418 will drop. Edge detector 344 does not toggle until both regulated voltage supply 416 and noisy voltage supply 418 have the same polarity such that the frequency drop of noisy voltage supply 418 (e.g., slower toggling) causes frequency 402 to also drop. During a voltage spike 406, the frequency of noisy voltage supply 418 can rise. Edge detector 344 does not toggle until both regulated voltage supply 416 and noisy voltage supply 418 share the same polarity such that frequency 402 is effectively clamped (e.g., will not rise above a frequency of regulated voltage supply 416). Thus, the adaptive oscillator can quickly adjust frequency 402 for effective power management and protection of components.

Returning to FIG. 3, because edge detector 344 and phase comparator circuit 330 can have the same inputs (e.g., reference delay circuit output signal 313 and noisy delay circuit output signal 315), in some examples phase comparator circuit 330 can be integrated with the adaptive oscillator circuit, such as with or near edge detector 344.

Figure 5:
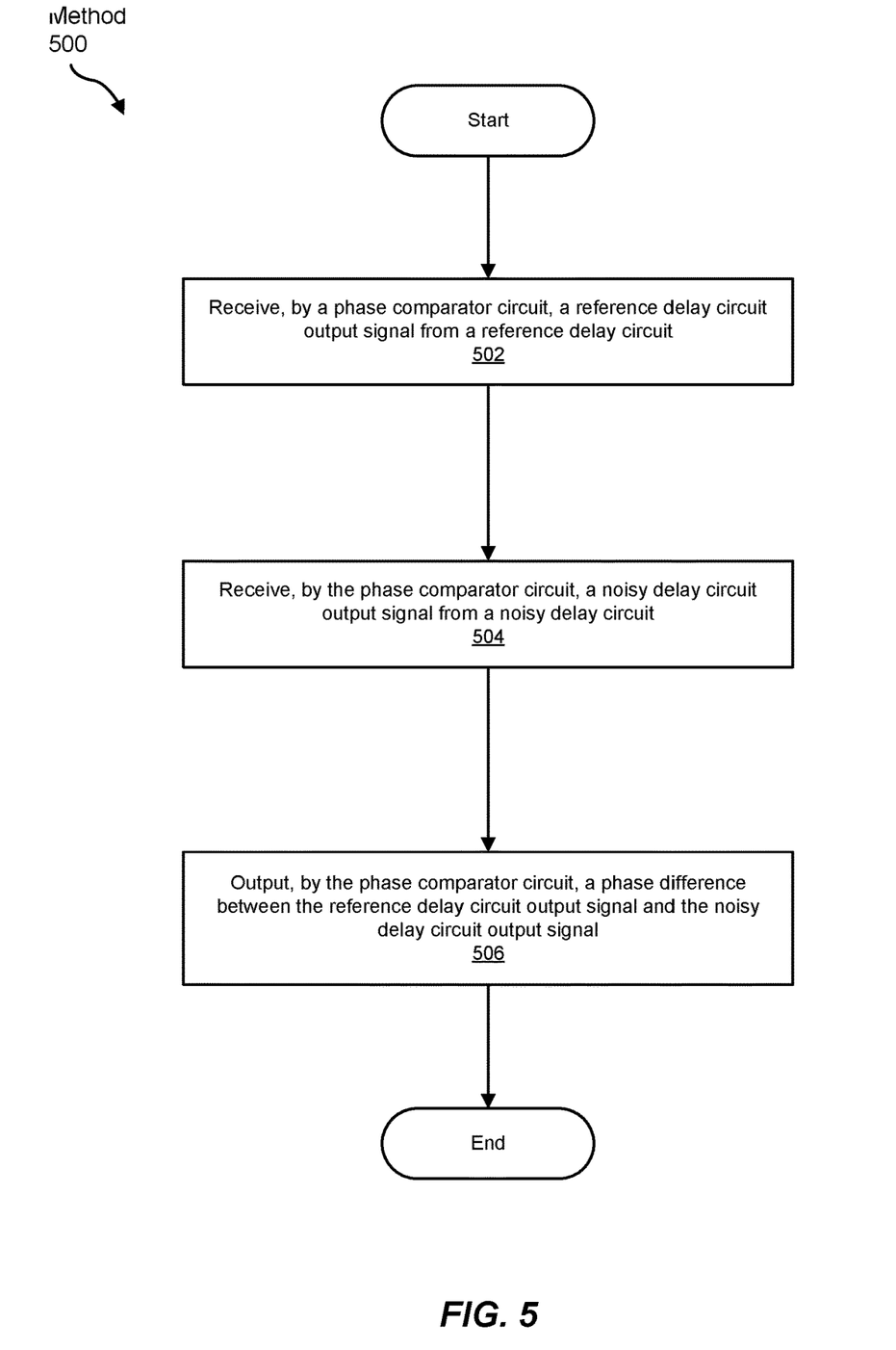
FIG. 5 is a flow diagram of an exemplary method for time domain-based power supply droop detection.

FIG. 5 is a flow diagram of an exemplary method 500 for time domain-based power supply droop detection. The steps shown in FIG. 5 can be performed by any suitable system, including the system(s) illustrated in FIGS. 1, 2 and/or 3. In one example, each of the steps shown in FIG. 5 represent an algorithm whose structure includes and/or is represented by multiple sub-steps, examples of which will be provided in greater detail below.

As illustrated in FIG. 5, at step 502 one or more of the systems described herein receives, by a phase comparator circuit, a reference delay circuit output signal from a reference delay circuit. For example, phase comparator circuit 130 receives a reference delay circuit output signal from reference delay circuit 112.

The systems described herein can perform step 502 in a variety of ways. In one example, reference delay circuit 112 converts regulated voltage supply 116 to a time domain (e.g., a signal phase) to provide the reference delay circuit output signal.

At step 504 one or more of the systems described herein receives, by the phase comparator circuit, a noisy delay circuit output signal from a noisy delay circuit. For example, phase comparator circuit 130 receives a noisy delay circuit output signal from noisy delay circuit 114.

The systems described herein can perform step 504 in a variety of ways. In one example, noisy delay circuit 114 converts noisy voltage supply 118 to the time domain (e.g., a signal phase) to provide the noisy delay circuit output signal.

At step 506 one or more of the systems described herein outputs, by the phase comparator circuit, a phase difference between the reference delay circuit output signal and the noisy delay circuit output signal. For example, phase comparator circuit 130 outputs a phase difference between the reference delay circuit output signal and the noisy delay circuit output signal.

As detailed above, in order to manage SOC power consumption in a timely fashion with fine resolution, a power management logic needs to receive data about on-die power supply rail voltage levels with minimal latency. Architectures based on a ring oscillator with a clock counter can be slow since clock counters have inherent latency. The architecture described herein can have a higher speed and good resolution since the on-die power supply voltage data is available within a Time-to-Digital Converter (TDC) intrinsic delay time.

As described herein, the systems and methods provided herein compare the phase difference of the outputs of the Reference Delay Circuit and the Noisy Delay Circuit. When the Noisy Delay Circuit power supply voltage is lower than the Reference Delay Circuit power supply voltage, the Noisy Delay Circuit output signal lags the Reference Delay Circuit output signal. Conversely, when the Noisy Delay Circuit power supply voltage is higher than the Reference Delay Circuit power supply voltage, the Noisy Delay Circuit output signal leads the Reference Delay Circuit output signal. The phase difference between these two signals is proportional to the power supply voltage difference.

The phase difference comparison can be done by a phase comparator or any other circuit that compares signals in time domain, such as phase signals. For example, the phase comparison can be implemented with a TDC which is widely used in the Digital PLLs. The TDC receives input signals from the Reference and Noisy Delay Circuits with the phase shift proportional to a voltage level difference between the regulated voltage and noisy voltage. The TDC translates the phase delta to a digital code. Therefore, the voltage difference will be represented by the digital code.

The voltage-to-time conversion is achieved by delay lines which have fast response to the power supply noise, and by TDC which has relatively small delay. The overall voltage-to-digital code conversion has smaller latency than the traditional ring oscillator clock counter solutions.

A power management system, which can include logic, controllers, firmware, and/or software, often requires data about on-die power supply rail voltage levels. The power management system can use this data to control and/or adjust power supply rail voltages and/or system clock frequencies to maximize performance and/or minimize power consumption. The systems and methods described herein can provide this data (e.g., the phase difference output as a digital code representing a voltage difference as described herein) to a power management system with minimum latency. Thus, the systems and methods herein allow the power management system to more efficiently control power supply rail voltages and/or system clock frequencies.

As detailed above, the computing devices and systems described and/or illustrated herein broadly represent any type or form of device or incorporated in a system capable of executing computer-readable instructions, such as those contained within the modules described herein. In their most basic configuration, these computing device(s) each include at least one memory device and at least one physical processor.

In some examples, the term "memory device" generally refers to any type or form of volatile or non-volatile storage device or medium capable of storing data and/or computer-readable instructions. In one example, a memory device stores, loads, and/or maintains one or more of the modules and/or circuits described herein. Examples of memory devices include, without limitation, Random Access Memory (RAM), Read Only Memory (ROM), flash memory, Hard Disk Drives (HDDs), Solid-State Drives (SSDs), optical disk drives, caches, variations, or combinations of one or more of the same, or any other suitable storage memory.

In some examples, the term "physical processor" generally refers to any type or form of hardware-implemented processing unit capable of interpreting and/or executing computer-readable instructions. In one example, a physical processor accesses and/or modifies one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), systems on a chip (SoCs), digital signal processors (DSPs), Neural Network Engines (NNEs), accelerators, graphics processing units (GPUs), portions of one or more of the same, variations or combinations of one or more of the same, or any other suitable physical processor.

In some implementations, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein are shown or discussed in a particular order, these steps do not necessarily need to be performed in the order illustrated or discussed. The various exemplary methods described and/or illustrated herein can also omit one or more of the steps described or illustrated herein or include additional steps in addition to those disclosed.

The preceding description has been provided to enable others skilled in the art to best utilize various aspects of the exemplary implementations disclosed herein. This exemplary description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device comprising:
   an oscillator circuit comprising:
      a reference delay circuit that is connected to a regulated voltage supply and is configured to provide a reference delay circuit output signal;
      a noisy delay circuit that is connected to a noisy voltage supply and is configured to provide a noisy delay circuit output signal; and
      a phase comparator circuit that is:
         coupled to the reference delay circuit and the noisy delay circuit; and
         configured to output a phase difference between the reference delay circuit output signal and the noisy delay circuit output signal.

2. The device of claim 1, wherein the reference delay circuit output signal corresponds to the regulated voltage supply converted to a time domain.

3. The device of claim 1, wherein the noisy delay circuit output signal corresponds to the noisy voltage supply converted to a time domain.

4. The device of claim 1, wherein the reference delay circuit corresponds to a first time delay circuit and the noisy delay circuit corresponds to a second time delay circuit.

5. The device of claim 4, wherein the first time delay circuit matches the second time delay circuit.

6. The device of claim 4, further comprising a second oscillator circuit, wherein the reference delay circuit and the noisy delay circuit are driven by the second oscillator circuit.

7. The device of claim 1, wherein the phase comparator circuit corresponds to a time-to-digital converter (TDC).

8. The device of claim 1, wherein the reference delay circuit and the noisy delay circuit are driven by a second oscillator circuit.

9. The device of claim 1, wherein the oscillator circuit further comprises an edge detector circuit that is:
   coupled to the reference delay circuit and the noisy delay circuit; and
   configured to receive the reference delay circuit output signal and the noisy delay circuit output signal and output a clock signal to the reference delay circuit and the noisy delay circuit.

10. The device of claim 9, wherein the edge detector circuit is configured to toggle a polarity of the clock signal when the received reference delay circuit output signal and the received noisy delay circuit output signal share a same polarity.

11. A system comprising:
   an oscillator circuit comprising:
      a reference delay circuit connected to a regulated voltage supply and configured to provide a reference delay circuit output signal that corresponds to the regulated voltage supply converted to a time domain;
      a noisy delay circuit connected to a noisy voltage supply and configured to provide a noisy delay circuit output signal that corresponds to the noisy voltage supply converted to the time domain; and
      a phase comparator circuit coupled to the reference delay circuit and the noisy delay circuit and configured to output a phase difference between the reference delay circuit output signal and the noisy delay circuit output signal.

12. The system of claim 11, wherein the reference delay circuit corresponds to a first time delay circuit and the noisy delay circuit corresponds to a second time delay circuit.

13. The system of claim 12, wherein the first time delay circuit matches the second time delay circuit.

14. The system of claim 12, further comprising a second oscillator circuit, wherein the reference delay circuit and the noisy delay circuit are driven by the second oscillator circuit.

15. The system of claim 11, wherein the phase comparator circuit corresponds to a time-to-digital converter (TDC).

16. The system of claim 11, wherein the oscillator circuit includes an edge detector circuit that is:
   coupled to the reference delay circuit and the noisy delay circuit; and
   configured to receive the reference delay circuit output signal and the noisy delay circuit output signal and output a clock signal to the reference delay circuit and the noisy delay circuit.

17. The system of claim 16, wherein the edge detector circuit is configured to toggle a polarity of the clock signal when the received reference delay circuit output signal and the received noisy delay circuit output signal share a same polarity.

18. A method comprising:
   receiving, by a phase comparator circuit of an oscillator circuit, a reference delay circuit output signal from a reference delay circuit of the oscillator circuit that is connected to a regulated voltage supply;
   receiving, by the phase comparator circuit, a noisy delay circuit output signal from a noisy delay circuit of the oscillator circuit that is connected to a noisy voltage supply; and
   outputting, by the phase comparator circuit, a phase difference between the reference delay circuit output signal and the noisy delay circuit output signal.

19. The method of claim 18, further comprising:
   converting, by the reference delay circuit, the regulated voltage supply to a time domain to provide the reference delay circuit output signal; and
   converting, by the noisy delay circuit, the noisy voltage supply to the time domain to provide the noisy delay circuit output signal.

20. The method of claim 18, further comprising toggling a polarity of a clock signal when the received reference delay circuit output signal and the received noisy delay circuit output signal share a same polarity.

* * * * *